United States Patent
Koehler et al.

(10) Patent No.: US 8,716,149 B2
(45) Date of Patent: May 6, 2014

(54) METHODS FOR FABRICATING INTEGRATED CIRCUITS HAVING IMPROVED SPACERS

(75) Inventors: Fabian Koehler, Dresden (DE); Sergej Mutas, Dresden (DE); Dina Triyoso, Dresden (DE); Itasham Hussain, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 107 days.

(21) Appl. No.: 13/482,871

(22) Filed: May 29, 2012

(65) Prior Publication Data

US 2013/0323923 A1 Dec. 5, 2013

(51) Int. Cl.
*H01L 21/31* (2006.01)
*H01L 21/469* (2006.01)

(52) U.S. Cl.
USPC ............ 438/769; 438/9; 438/513; 438/745; 257/E21.006; 257/E21.009; 257/E21.077; 257/E21.079; 257/E21.17; 257/E21.228; 257/E21.229; 257/E21.248; 257/E21.267; 257/E21.278; 257/E21.293; 257/E21.311

(58) Field of Classification Search
USPC ............ 438/769, 745, 513, 9, 509, 311, 514, 438/791, 756, 757, 257, E21.006, E21.009, 438/E21.077, E21.079, E21.17, E21.229, 438/E21.228, E21.248, E21.267, E21.278, 438/E21.293, E21.311
See application file for complete search history.

(56) References Cited

U.S. PATENT DOCUMENTS

| | | | | |
|---|---|---|---|---|
| 6,316,304 B1 * | 11/2001 | Pradeep et al. | ............... | 438/230 |
| 6,448,167 B1 * | 9/2002 | Wang et al. | ................... | 438/595 |
| 6,991,991 B2 * | 1/2006 | Cheng et al. | .................. | 438/303 |
| 7,323,377 B1 * | 1/2008 | Sedigh et al. | ................ | 438/197 |
| 7,495,280 B2 * | 2/2009 | Lo | ................................ | 257/314 |
| 7,897,501 B2 * | 3/2011 | Cheng et al. | .................. | 438/595 |

\* cited by examiner

*Primary Examiner* — David Nhu
(74) *Attorney, Agent, or Firm* — Ingrassia Fisher & Lorenz, P.C.

(57) ABSTRACT

Methods for fabricating integrated circuits are provided. In an embodiment, a method for fabricating an integrated circuit includes providing a semiconductor substrate having a gate structure. An atomic layer deposition (ALD) process is performed to deposit a spacer around the gate structure. The ALD process includes alternating flowing ionized radicals of a first precursor across the semiconductor substrate and flowing a chlorosilane precursor across the semiconductor substrate to deposit the spacer.

20 Claims, 4 Drawing Sheets

METHODS FOR FABRICATING INTEGRATED CIRCUITS HAVING IMPROVED SPACERS

TECHNICAL FIELD

The present disclosure generally relates to methods for fabricating integrated circuits, and more particularly relates to methods for fabricating integrated circuits with improved spacers.

BACKGROUND

Silicon dioxide has been used as a gate oxide material in integrated circuits for decades. As integrated circuits have decreased in size, the thickness of the silicon dioxide gate dielectric has steadily decreased to increase the gate capacitance and thereby drive current, raising device performance. However, as the gate dielectric thickness scales below 2 nm, leakage currents due to tunneling increase drastically and leads to high power consumption and reduced device reliability. In order to allow increased gate capacitance with the associated leakage effects, the silicon dioxide gate dielectric has been replaced with a high-k material.

Processes for depositing spacers around high-k metal gate structures are typically kept at low to moderate temperatures so that diffusion of halo or extension implants or of layers containing oxygen does not affect electrical properties of the high-k gate insulator. Conventionally, plasma enhanced chemical vapor deposition (PECVD) processes are used to deposit spacer layers at low temperatures. However, current PECVD processes result in non-uniform spacer thicknesses across isolated and dense device areas on semiconductor substrates. Non-uniformity of spacer thicknesses leads to different implant profiles resulting in electrical variation.

Accordingly, it is desirable to provide integrated circuits having improved spacers and methods for fabricating integrated circuits having improved spacers. In addition, it is desirable to provide methods for fabricating integrated circuits which form spacers at lower temperatures. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In accordance with one embodiment, a method for fabricating an integrated circuit includes providing a semiconductor substrate having a gate structure. An atomic layer deposition (ALD) process is performed to deposit a spacer around the gate structure. The ALD process includes alternately flowing ionized radicals of a first precursor across the semiconductor substrate and flowing a chlorosilane precursor across the semiconductor substrate to deposit the spacer.

In another embodiment, a method for fabricating an integrated circuit is provided and includes providing a semiconductor substrate having a gate structure. A first atomic layer deposition (ALD) process is performed at no more than about 200° C. to deposit a first spacer layer around the gate structure. A second ALD process is performed to deposit a second spacer layer around the first spacer layer. The first spacer layer and the second spacer layer are etched to form a spacer around the gate structure.

In accordance with another embodiment, a method for fabricating an integrated circuit is provided and includes forming a gate structure on a semiconductor substrate. A spacer is formed around the gate structure and includes an inner spacer layer deposited at a first temperature and having a first wet etch resistance. Further, the spacer includes an outer spacer layer deposited at a second temperature and having a second wet etch resistance. The second temperature is greater than the first temperature and the second wet etch resistance is greater than the first wet etch resistance.

BRIEF DESCRIPTION OF THE DRAWINGS

Embodiments of the integrated circuits having improved spacers and methods for fabricating integrated circuits having improved spacers will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having improved spacers and methods for fabricating integrated circuits having improved spacers are provided. Problems with convention processes for forming spacers may be reduced through the use of atomic layer deposition (ALD) processes using cycles of selected precursors or through ALD processes resulting in dual-layer spacers. Specifically, exemplary methods provide for highly uniform spacers with constant thicknesses despite location in dense or isolated regions of integrated circuits. Further, exemplary methods provide for reduced thermal budget, and reduced thermal exposure of previously-formed features on the substrates, while retaining sufficient resistance to subsequent processing, such as with etchants.

In an exemplary embodiment, the methods for fabricating integrated circuits form highly homogenous silicon nitride spacers around gate structures through an ALD process performed at moderate temperature (such as at about 400° C.). Specifically, the ALD process is performed by cycling flows of ionized radicals of a first precursor and a second precursor over the gate structures. The desired spacer thickness is obtained by performing a selected number of cycles in the ALD process.

Figure 1:
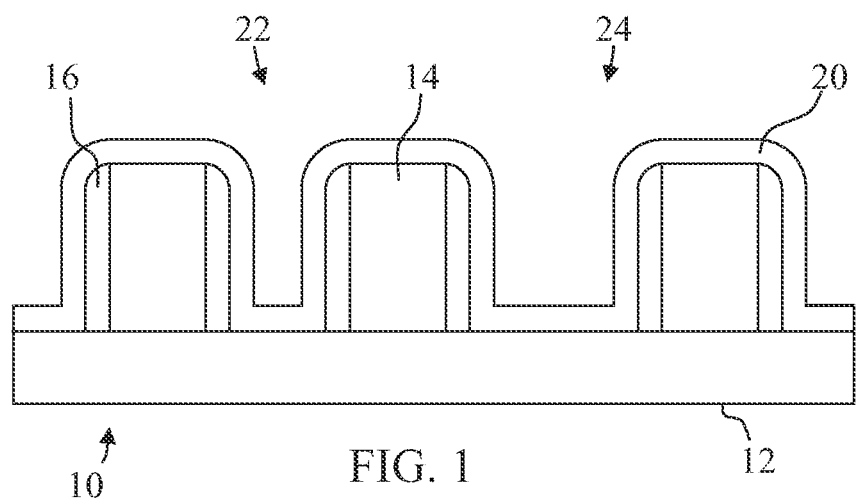
FIGS. 1-2 illustrate, in cross section, a portion of an integrated circuit and method steps for fabricating an integrated circuit in accordance with various embodiments herein.
Figure 2:
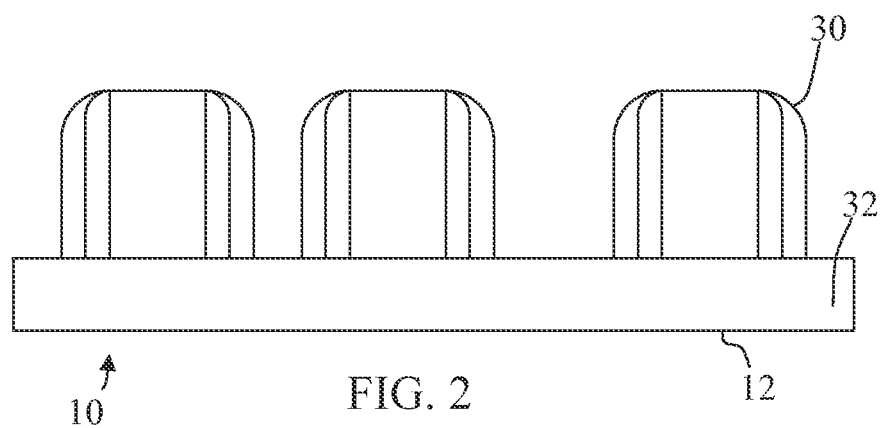

FIGS. 1-2 illustrate sequentially a method for fabricating such integrated circuits in accordance with various embodiments herein. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components.

In FIG. 1, in an exemplary embodiment, the process of fabricating an integrated circuit 10 begins by providing a semiconductor substrate 12 on which high-k metal gate structures 14 are formed. The semiconductor substrate 12 is typically a silicon wafer and may also include other elementary semiconductor materials such as germanium. Alternatively, the substrate 12 may include a compound semiconductor such as, silicon carbide, gallium arsenide, indium arsenide, or indium phosphide. Further, the substrate 12 may optionally include an epitaxial layer (epi layer), may be strained for performance enhancement, and/or may include a silicon-on-insulator (SOI) structure.

In a typical process, the gate structures 14 are formed after formation of isolation (STI) regions and well implants. Though not illustrated, the gate structures 14 typically include gate dielectric or oxide and metal workfunction layers. As shown, each gate structure 14 is encapsulated by a spacer 16, typically an oxide spacer referred to as spacer-0. These spacers 16 are formed by depositing and etching an oxide layer, and are used to place shallow source/drain extensions and/or halo implants a desired distance from the edges of the gate structures 14.

After implantations are performed to form the extensions and/or halo implants, a highly uniform spacer layer 20, such as a layer of silicon nitride, is deposited over the gate structures 14 and semiconductor substrate 12. As shown in FIG. 1, the distance between gate structures 14 varies on the integrated circuit 10. Specifically, in dense area 22 the gate structures 14 are closer to one another than in isolated area 24. For device performance, it is vital that the spacer layer 20 be deposited with a uniform thickness across dense and isolated areas 22, 24, as different sidewall thicknesses lead to different implant profiles resulting in electrical variation. Atomic layer deposition (ALD) results in uniform deposition regardless of the density of spacing on the substrate 12. After the spacer layer 20 is deposited, it is etched as shown in FIG. 2 to provide uniform spacers 30 around the gate structures 14. Thereafter, the spacers 30 are used to place deep source/drain implants 32 in the substrate 12 at a desired distance, e.g., 10 to 20 nm, from the edges of the gate structures 14.

Figure 3:
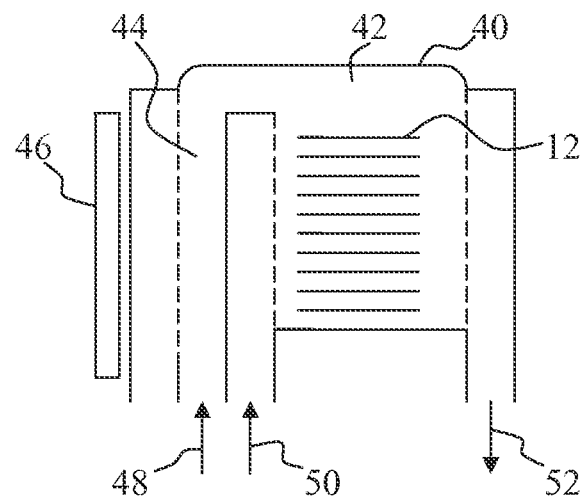
FIG. 3 illustrates, in schematic form, a reactor for fabricating the integrated circuit of FIGS. 1-2.

Referring to FIG. 3, a cross flow reactor 40 for performing the spacer layer deposition is illustrated. As shown, the furnace includes a reaction chamber 42 in which a plurality of substrates 12 are received. A plasma chamber 44 is located in communication with the reaction chamber 42 and is provided with a radiofrequency (RF) ion source 46 for plasma activation of a first precursor 48. A second precursor 50 is also in communication with the chamber 42. During an exemplary atomic layer deposition (ALD) process, up to 100 substrates 12 are positioned in the chamber 42. Then, the first precursor is ionized by the RF ion source 46 in the plasma chamber 44 and is flowed across the substrates 12. An exhaust stream 52 exits the chamber 42. After the first precursor flow, the second precursor 50 is flowed across the substrates 12 and exits the reaction chamber 42 in exhaust stream 52. During the cycle, first precursor 48 and second precursor 50 react with the exposed surfaces of the substrates 12, and gate structures 14 and spacer 16 thereon, one-at-a-time in a sequential manner. Through the sequential and repeated exposure, the spacer layer 20 is deposited as a thin film.

Figure 4:
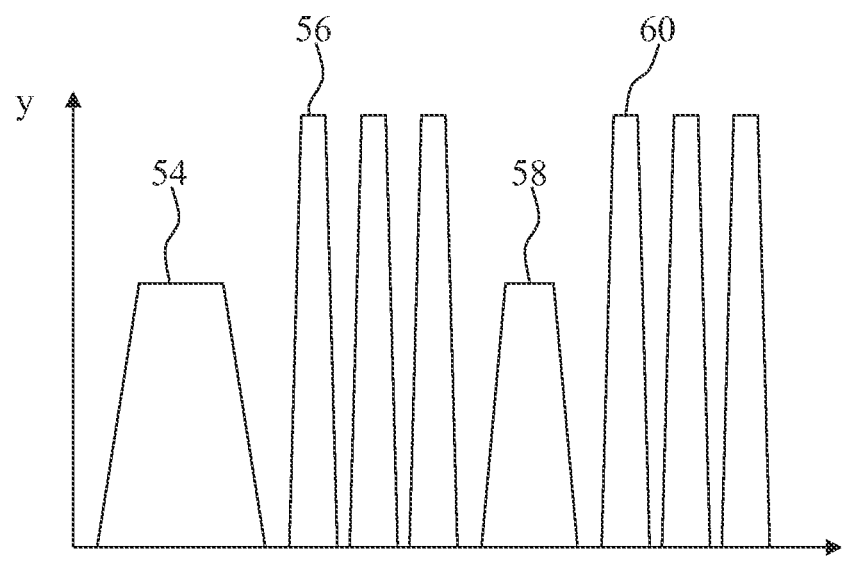
FIG. 4 represents an atomic layer deposition cycle used in the fabrication of the integrated circuit of FIGS. 1-2.

FIG. 4 is a graphical representation of the flows of the precursors 48, 50 in a cycle of the ALD process. As illustrated, the y-axis of the graph measures gas flow and the x-axis measures time. In an exemplary embodiment, the gas flow of the first precursor, identified by 54, lasts for approximately 40 seconds, including ramp up and ramp down periods. After the first precursor flow, three high volume nitrogen gas purges 56 are performed to purge the reaction chamber 42. Then, the second precursor flow, identified by 58, is performed for approximately 5 seconds again followed by three nitrogen purges 60. As is understood, the number of cycles performed in ALD process can be controlled to form a spacer layer 20 of a desired thickness. For example, 350 cycles may be performed to form a spacer layer 20 having a thickness of about 220 Angstroms.

Exemplary first precursors include ionized radicals of ammonia ($NH_3$), hydrazine ($N_2H_4$), and deuterated ammonia ($ND_3$). Exemplary second precursors are chlorosilanes including monochlorosilanes ($SiH_3Cl$), dichlorosilanes ($H_2SiCl_2$), trichlorosilanes ($HSiCl_3$), deuterated monochlorosilanes ($SiD_3Cl$), deuterated dichlorosilanes ($D_2SiCl_2$), and deuterated trichlorosilanes ($DSiCl_3$). In an exemplary process, the boat holding the substrates is loaded into the reaction chamber under reduced temperatures, such as about 70° C. to about 250° C. After receiving the substrates, the chamber is evacuated and heated to an exemplary deposition temperature of about 400° C. The deposition process of alternating gas flows is then performed.

In another embodiment, the methods for fabricating integrated circuits form two-layer silicon nitride spacers around gate structures through a two-step plasma-enhanced atomic layer deposition (PEALD) process, with the first deposition performed at a low temperature (such as less than about 200° C.) and the second deposition performed at a more moderate temperature such as at about 300° C. to about 400° C. The resulting spacer has sufficient etch resistance to endure further processing, but is formed with a low thermal budget. Specifically, the thermal budget is conserved during formation of the inner layer formed at low temperature, while the outer layer formed at higher temperature exhibits sufficient etch resistance. Further, the layers deposited by PEALD exhibit greater thickness uniformity than those formed by conventional plasma enhanced chemical vapor deposition (PECVD) processes.

Figure 5:
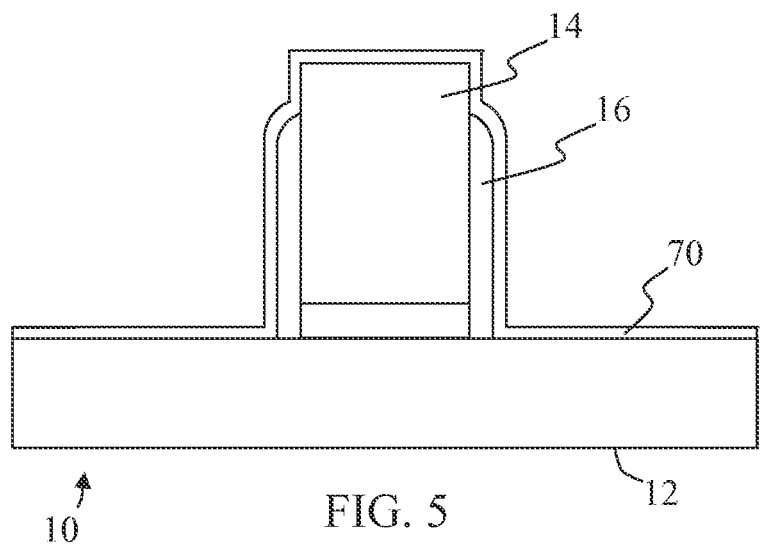
FIGS. 5-8 illustrate, in cross section, a portion of an integrated circuit and method steps for fabricating an integrated circuit in accordance with certain embodiments herein
Figure 6:
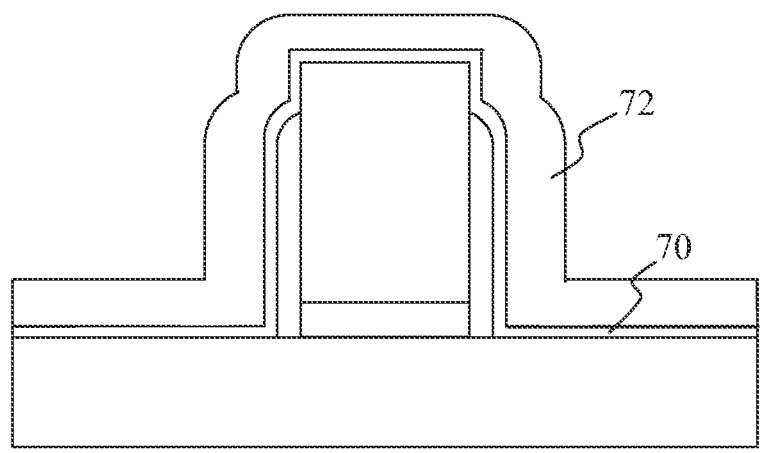

Referring to FIG. 5, a high-k metal gate structure 14 is again formed on a semiconductor substrate 12 according to typical semiconductor process flow. As shown, a spacer 16 is formed around the gate structure 14, such as for forming shallow source/drain extensions and halo implants. Also, a thin spacer liner 70, such as oxide, is deposited over the substrate 12 and gate structure 14. In FIG. 6, a first or inner spacer layer 72 is then deposited over the spacer liner 70. An exemplary spacer layer 72 is deposited by a low temperature PEALD process performed at a temperature of about 100° C. to about 200° C.

Figure 7:
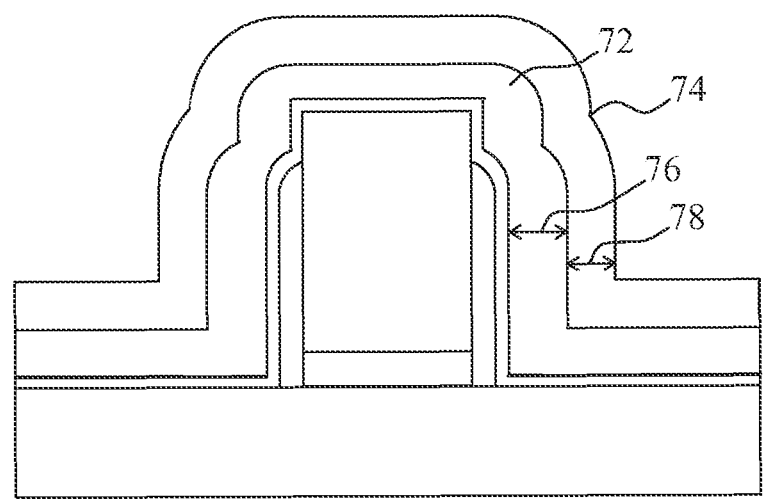

In FIG. 7, a second or outer spacer layer 74 is deposited over spacer layer 72. In an exemplary process, the deposition of layers 72, 74 occurs within different chambers in a single platform. Therefore, the layers 72, 74 can be deposited at different temperatures, but without a vacuum break. An exemplary spacer layer 74 is deposited by a moderate temperature PEALD process performed at a temperature of about 300° C. to about 400° C. As shown, spacer layer 72 has a thickness 76 and spacer layer 74 has a thickness 78 that is no greater than thickness 76. In an exemplary embodiment, thickness 78 is approximately less than 90%, such as less than 75%, or for example less than 50%, of thickness 76.

Figure 8:
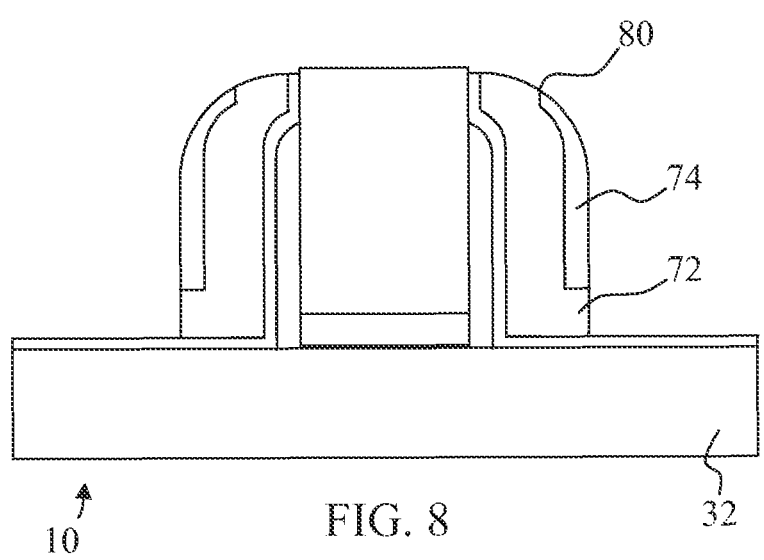

After depositing spacer layers 72, 74, the layers 72, 74 are etched to form a spacer 80 for aligning subsequent implants to form deep source/drain regions 32 as illustrated in FIG. 8. As shown, the spacer 80 is formed from the spacer layer 72 that is deposited at low temperature and the spacer layer 74 which is deposited at higher temperature. Silicon nitride deposited by PEALD has better resistance to wet etchants such as hot phosphoric acid than PECVD silicon nitride. However, as nitrides deposited at lower temperatures have reduced densities, the resistance to wet etchants for PEALD nitrides decreases with decreasing deposition temperatures. Therefore, layer 74 is more resistant to wet etchants than layer 72. The dual-layer properties of spacer 80, therefore, allows spacer 80 to be formed with a lower thermal budget but provides spacer 80 with sufficient resistance to wet etchants to endure subsequent processing. Specifically, over 50% of spacer 80 is formed at a lower temperature than is typically suitable for wet etchant resistance, but is covered with a layer 74 deposited at higher temperatures, resulting in a sufficiently etchant resistant spacer 80.

In an exemplary embodiment, the total sidewall thickness of the spacer 80 is between about 200 Angstroms and 250 Angstroms. The first layer thickness is equal to or greater than the second layer thickness. For example, the first layer 72 may have a thickness of about 100 Angstroms to about 200 Angstroms and the second layer 74 may have a thickness of about 50 Angstroms to about 100 Angstroms. Typically, the first layer 72 is deposited during a processing period of less than about 10 minutes, such as about 5 minutes. The second layer 74 is deposited during a processing period of less than about 10 minutes, such as about 5 minutes.

In various embodiments, the methods herein may continue to include process steps such as deposition or formation of passivation layers, contacts, interconnect structures (e.g., lines and vias, metal layers, and interlayer dielectric material to provide electrical interconnection to the device including the gate structures 14.

As described above, fabrication processes are implemented to form integrated circuits with improved spacers. Problems with convention processes for forming spacers may be reduced through the use of ALD processes using cycles of selected precursors or through ALD processes resulting in dual-layer spacers. Specifically, exemplary methods provide for highly uniform spacers with constant thicknesses despite location in dense or isolated regions of integrated circuits. Further, exemplary methods provide for reduced thermal budget, and reduced thermal exposure of previously-formed features on the substrates, while retaining sufficient resistance to subsequent processing, such as with etchants.

To briefly summarize, the fabrication methods described herein result in integrated circuits having spacers with improved performance. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
   providing a semiconductor substrate having a gate structure; and
   performing an atomic layer deposition (ALD) process to deposit a spacer around the gate structure, wherein the ALD process comprises alternating cycles of a first precursor flow and a second precursor flow to deposit the spacer, wherein the first precursor flow includes flowing ionized radicals of a first precursor across the semiconductor substrate and wherein the second precursor flow includes flowing a chlorosilane precursor across the semiconductor substrate.

2. The method of claim 1 wherein the first precursor is selected from ammonia, hydrazine, and deuterated ammonia, and wherein the ALD process comprises flowing ionized radicals of ammonia, hydrazine, or deuterated ammonia across the semiconductor substrate.

3. The method of claim 1 wherein the chlorosilane precursor is selected from monochlorosilanes, dichlorosilanes, trichlorosilanes, deuterated monochlorosilanes, deuterated dichlorosilanes, and deuterated trichlorosilanes, and wherein the ALD process comprises flowing monochlorosilanes, dichlorosilanes, trichlorosilanes, deuterated monochlorosilanes, deuterated dichlorosilanes, or deuterated trichlorosilanes across the semiconductor substrate to deposit the spacer.

4. The method of claim 1 wherein the ALD process comprises alternating about 350 cycles of the first precursor flow and the second precursor flow to deposit the spacer, and wherein the spacer has a thickness of about 220 Angstroms.

5. The method of claim 1 further comprising maintaining a temperature of about 400° C. while depositing the spacer.

6. A method for fabricating an integrated circuit comprising:
   providing a semiconductor substrate having a gate structure;
   performing a first atomic layer deposition (ALD) process at no more than about 200° C. to deposit a first spacer layer around the gate structure;
   performing a second ALD process to deposit a second spacer layer around the first spacer layer; and
   etching the first spacer layer and the second spacer layer to form a spacer around the gate structure.

7. The method of claim 6 further comprising maintaining a low pressure environment during and between the first and second ALD processes.

8. The method of claim 6 wherein performing the first ALD process comprises performing the first ALD process at a temperature of about 100° C. to about 200° C.

9. The method of claim 6 wherein performing the second ALD process comprises performing the second ALD process at a temperature of about 400° C.

10. The method of claim 6 wherein performing the first ALD process comprises performing a plasma assisted atomic layer deposition (PEALD) process to form a silicon nitride first spacer layer around the gate structure.

11. The method of claim 10 wherein performing the second ALD process comprises performing a PEALD process to form a silicon nitride second spacer layer around the first spacer layer.

12. The method of claim 6 wherein the first spacer layer has a first thickness, and wherein performing the second ALD process comprises depositing the second spacer layer to a second thickness no greater than the first thickness.

13. The method of claim 6 wherein providing the semiconductor substrate having the gate structure comprises:
   forming a high K metal gate structure on the semiconductor substrate; and
   depositing an oxide liner overlying the high K metal gate structure and the semiconductor substrate.

14. The method of claim 13 wherein etching comprises etching the first spacer layer, the second spacer layer, and the oxide liner to form the spacer around the gate structure.

15. The method of claim 6 wherein performing the first ALD process comprises:
  performing a first plasma assisted atomic layer deposition (PEALD) process to deposit the first spacer layer having a first wet etch resistance; and
  performing a second PEALD process to deposit the second spacer layer having a second wet etch resistance greater than the first wet etch resistance.

16. The method of claim 6 further comprising performing a source/drain implant self-aligned with the spacer.

17. A method for fabricating an integrated circuit comprising:
  forming a gate structure on a semiconductor substrate;
  forming a spacer around the gate structure, wherein the spacer includes an inner spacer layer deposited at a first temperature and having a first wet etch resistance, wherein the spacer includes an outer spacer layer deposited at a second temperature and having a second wet etch resistance, and wherein the second temperature is greater than the first temperature and the second wet etch resistance is greater than the first wet etch resistance.

18. The method of claim 17 wherein forming the spacer comprises:
  performing a first atomic layer deposition (ALD) process at no more than about 200° C. to deposit the inner spacer layer around the gate structure;
  performing a second ALD process to deposit the outer spacer layer around the inner spacer layer; and
  etching the inner spacer layer and the outer spacer layer to form the spacer around the gate structure.

19. The method of claim 17 wherein forming the spacer comprises:
  performing a first plasma assisted atomic layer deposition (PEALD) process to form a silicon nitride inner spacer layer around the gate structure;
  performing a second PEALD process to form a silicon nitride outer spacer layer around the inner spacer layer; and
  etching the inner spacer layer and the outer spacer layer to form the spacer around the gate structure.

20. The method of claim 17 wherein forming the spacer comprises forming the inner spacer layer with a first thickness and forming the outer spacer layer with a second thickness, and wherein the second thickness is no greater than the first thickness.

* * * * *